United States Patent [19]

Crewe

[11] Patent Number: 4,740,705

[45] Date of Patent: Apr. 26, 1988

[54] AXIALLY COMPACT FIELD EMISSION CATHODE ASSEMBLY

[75] Inventor: Albert V. Crewe, Palos Park, Ill.

[73] Assignee: Electron Beam Memories, Palo Alto, Calif.

[21] Appl. No.: 895,202

[22] Filed: Aug. 11, 1986

[51] Int. Cl.⁴ .............................................. H01J 37/26
[52] U.S. Cl. ............................ 250/423 F; 250/423 R; 313/310; 313/336
[58] Field of Search ............ 250/423 F, 492.3, 423 R; 313/310, 336, 361.1, 363.1, 271; 219/121 ET

[56] References Cited

U.S. PATENT DOCUMENTS

| | | | |
|---|---|---|---|
| 2,335,818 | 11/1943 | Trumbull et al. | 313/336 |
| 3,731,095 | 5/1973 | Komoda | 250/211 R |
| 3,786,268 | 1/1974 | Nomura | 250/306 |
| 3,810,025 | 5/1974 | Aihara et al. | 313/336 |
| 4,020,387 | 4/1977 | Coates et al. | 313/31 R |
| 4,137,476 | 1/1979 | Ishii et al. | 313/336 |
| 4,193,013 | 3/1981 | Futamoto et al. | 313/341 |
| 4,258,283 | 3/1981 | Brünger et al. | 313/336 |
| 4,482,839 | 11/1984 | Wada et al. | 313/346 R |

OTHER PUBLICATIONS

Electron Gun Using a Field Emission Source, A. V. Crewe, Rev. of Science Instru., vol. 39, No. 4, pp. 576–583, Apr. 1968.

Primary Examiner—Bruce C. Anderson
Assistant Examiner—Paul A. Guss

[57] ABSTRACT

An axially compact field emission cathode assembly for use in an electron beam device comprises a field emission tip, an electriclly conductive filament for mechanically supporting said tip and for receiving and conducting to said tip a predetermined electrical potential for exciting said filament to cause electron emission from said tip. Filament support means supports the filament with the tip positioned on an electron beam axis within said device. The cathode assembly is characterized by the filament being supported by said filament support means to extend transversely to the electron beam axis, whereby to reduce the axial length of the device.

7 Claims, 1 Drawing Sheet

AXIALLY COMPACT FIELD EMISSION CATHODE ASSEMBLY

CROSS-REFERENCE TO RELATED APPLICATIONS

This application is related to, but no way dependent upon, my copending applications Ser. No. 825,219, filed Feb. 3, 1986; Ser. No. 909,015, filed Sept. 18, 1986; Ser. No. 895,199, filed Aug. 11, 1986; and Ser. No. 895,200, filed Aug. 11, 1986.

BACKGROUND OF THE INVENTION

This invention relates to field emission cathodes. Field emission cathodes employ a field emission source, typically a minute tungsten crystal having an extremely fine emitting tip. The crystal is mounted on a filament which also serves, if the crystal is heated, as a heating element for the cyrstal. (As used hereinafter, the term "tip" means the entire crystal as well as its tip). The filament further serves to receive a source of electrical potential for electrically exciting the tip.

A field emission cathode, whether heated or cold, may be used in a variety of electron beam systems and devices which require or favorably utilize a very small, extremely bright source of electrons, such as electron microscopes and electron lithography systems.

This invention pertains particularly to an improved mount for the field emitting tip of a field emission cathode. Although this invention may have application in a variety of electron beam devices and systems, its need is extreme in any application wherein axial compactness of the cathode or associated gun is of critical importance.

Such an application exists in the electron beam memory systems described in my referent copending applications, Ser. No. 825,219 and Ser. No. 895,199.

It is a primary object of the inventions described and claimed in each of those applications to provide an electron beam memory system having an electron gun capable of developing high enough electron probe current densities to permit no-develop recording and small enough probe sizes to permit ultra-high density, high rate recording, yet of such low mass and compactness as to make feasible rapid random accessing of any area on the system's recording medium.

In the context of said systems, an improved mount for the electron field emitter is needed. It is known to mount the tiny field emission tip of a field emission cathode on a hairpin shaped filament. The axis of the "hairpin" is aligned with the electron beam axis; the tip is secured, as by welding, to the bend of the hairpin. The hairpin is carefully mounted such that the emitting tip is on the electron beam axis. As noted, the supporting filament is energized with a heater current in those applications in which the field emission is to be aided by heating the tip.

Such conventional field emission cathodes require mechanical and electrical isolation of the field emitter from the other gun components. The end result is typically a field emitter assembly having significant axial depth.

In electron beam memory systems of the type described in my above-identified copending applications, Ser. No. 825,219 and Ser. No. 895,199, in order to achieve the necessary fast access times of the electron beam head used for recording, reading or verification, it is imperative that the mass of the system's electron gun be as small as possible. Since size of the gun inevitably translates into mass, it is critically important in these systems that every dimension of the electron gun be reduced as small as possible.

PRIOR ART

U.S. Pat. No. 3,731,095
U.S. Pat. No. 3,286,268
Electron Gun Usinga Field Emission Source, A. V. Crewe, Rev. of Science Instru., Vol. 39, No. 4, pp. 576–583, April 1968.

OBJECTS OF THE INVENTION

It is a general object of this invention to provide an electron gun of the field emission cathode type for use in electron microscopes, electron beam memory systems, electron beam lithographic systems and the like which has minimum axial length and mass.

It is a more specific object to provide for use in such a gun a field emission cathode assembly having significantly reduced axial length, and thus making possible electron gun constructions of significantly reduced mass.

It is a further object to provide an improved field emission cathode assembly which provides ready access to the filament for application of the heating current, if desired, and which has low susceptibility to termianl overheating by the filament heater current.

It is still another object to provide such a field emission cathode assembly which offers a high degree of mechanical and thermal stability and of mechanical and electrical isolation for the tip, as well as reduced vibration of the emitter tip.

DESCRIPTION OF THE PREFERRED EMBODIMENT

The electron gun according to the present invention has numerous uses in applications requiring or desiring ultra-compactness, extremely low mass and a relatively high current density. One of the most promising applications envisioned is in an electron beam memory system.

Figure 1:
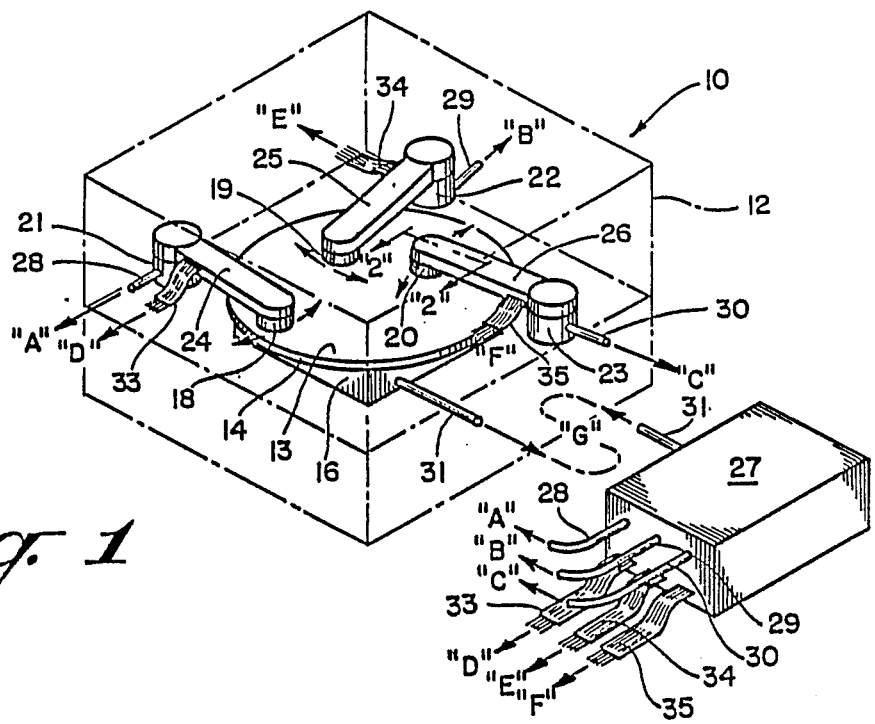
FIG. 1 is a highly schematic illustration of an electron beam memory system constructed to employ the teachings of the present invention.

FIG. 1 is a schematic view of an electron beam memory system 10 embodying the present invention. The FIG. 1 system 10 is shown as including a vacuum enclosure, depicted schematically in dotted line form at 12. Within the enclosure is a storage medium 13 supported on a rotatable disc 14. The disc 14 is rotated by a disc drive shown schematically at 16.

In nearly all disc-type electron beam memory systems disclosed in the prior art, the electron optical head or column is monolithic and immovable, requiring that the turntable be translated within the vacuum enclosure. Vacuum compatibility for such drive systems introduces lubrication and other problems. In the present system, the drive 16 is stationary and is therefore preferably located outside the vacuum enclosure 12. Further, compared with a system in which the turntable is moved, the vacuum enclosure volume is greatly reduced.

The electron beam memory system 10 includes a plurality of electron beam heads adapted for simultaneous operation. In the illustrated embodiment, I have shown three heads—a writing head 18 containing an electron gun for recording information, a verification head 19 containing an electron gun for verifying the fact and integrity of the stored information, and a reading head 20 containing an electrongun for retrieving the stored information.

The electron beam memory system 10 is illustrated schematically as including head drives 21, 22, 23 interconnected with the heads 18, 19, 20 by support arms 24, 25, 26 for moving the heads 18, 19, 20 across the disc 14.

Auxiliary electronic and electrical apparatus, shown schematically at 27, provides the necessary drive signals through conductors 28, 29, 30 for energizing head drives 21, 22, 23. Apparatus 27 also supplies through conductor 31 suitable drive signals for the disc drive 16, as well as the necessary heater current for the field emission source heater and energization potentials for the gun electrodes through bundles of conductors 33, 34, 35.

Figure 2:
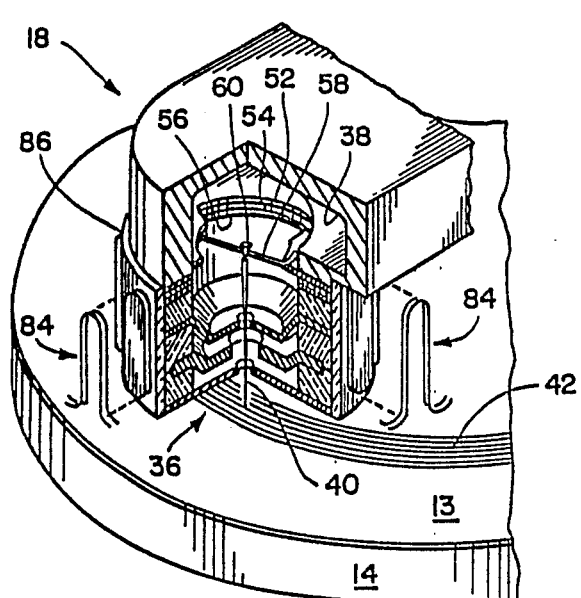
FIG. 2 is a perspective, partly sectioned view of a head constituting part of the FIG. 1 system and containing a writing or reading electron gun implementing an aspect of the present invention.

FIG. 2 illustrates a writing electron gun 36 constituting part of writing head 18 and described and claimed in referent application Ser. No. 895,199. As will be described, the FIG. 2 gun is capable of developing a finely focused electron beam probe at high beam current densities, yet is ultra-compact and of extremely low mass. That electron gun makes possible a truly random accessed electron beam memory system for high rate, ultra-high density electron beam data recording, and yet with recording power making possible no-develop recording, i.e., recording without the need for developing the recording medium after exposure. With the writing electron gun according to that invention, a very high capacity electron beam storage medium which is supported, e.g., on a rotatable disc, can be employed using multiple accessory verification and reading heads to permit simultaneous recording and reading over long periods of time—a critically important capability for a great many applications. As noted above, because of the vast storage capability of an electron beam memory system such as that, it may be totally impractical in many applications to delay access to the memory until the memory is filled (which could take weeks or months), during which time the stored information is inaccessible.

An electron beam memory system become truly universally useful only when it has the capability to record without any development of the medium using a rapid random accessing head and with simultaneously operable pick-up heads for verifying and/or retrieving the stored information as soon as it is recorded.

Figure 3:
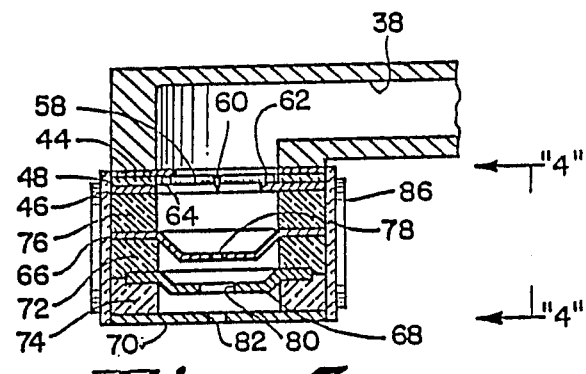
FIG. 3 is a sectioned side elevation view of the electron beam memory system head and electron gun shown in FIG. 2.

As shown in FIGS. 2–3, an electron beam head/gun assembly in accordance with the invention claimed in my application Ser. No. 895,199 is illustrated as including a vacuum manifold 38. The electron gun assembly 36 is appended to the vacuum manifold 38 and develops and extremely fine electron beam probe 40 of sufficiently great current density to write (record) tracks 42 on the storage medium 13 on disc 14.

The electron gun assembly 36 comprises an extremely axially compact structure, all components of the gun being optimized for axial compactness and minimization of mass.

As will be described, the series of structures making up the electron gun assembly 36 are all essentially ring-like elements of metal or ceramic adapted to be brazed together by well-known techniques to make an extremely rugged and hermetically sealed structure.

In accordance with this invention, the electron gun 36 utilizes a novel field emission cathode assembly. The field emission cathode assembly shown in FIGS. 2-3 is described and claimed in my copending application Ser. No. 895,199. The field emission cathode assembly comprises two metal rings 44, 46 between which is sandwiched a ceramic ring 48. The metal rings 44, 46 and ceramic ring 58 define circular apertures 52, 54 and 56 respectively. The rings 44, 46 may be composed of molybdenum and are brazed to the ceramic ring; the metal ring 44 is welded to the vacuum manifold 38 to form a rigid hermitically sealed assembly.

A filament 58 extends substantially diametrically across the apertures 52, 54, 56 formed in the rings 44, 46, 48 and has welded medially thereof a field emission tip 60. The tip 60 is aligned on the electron potential, the tip 60 produces an extremely small and intensely bright source of electrons.

The metal rings 44, 46 serve as expedient terminals for the application of filament heating currents for use in applications wherein the field emitter is heated. The out-turned ends 62, 64 of the filament 58 are welded to the rings 44 and 46, respectively, from which rings the filament may derive a source of appropriate electrical potential for extracting electons from the tip 60. The use of rings 44, 46 as terminals for the application of heater currents has a decided advantage over bringing wire leads in through the enclosure for the field emitter. They provide a mechanically rugged, hermetically sealed assembly. Of equal importance, the rings 44, 46 constitute terminals for easy connection to sources of heater current and excitation potential. Further, the large area of the terminals serve to dissipate heat over a large terminal area, and thus minimizing concern for failure of the terminals due to overheating. The use of a filament 58 extending diagonally across the openings, rather than the common "hairpin" filament, has the further advantage of being less susceptible to vibration. The rings 44, 46, 48 being concentric, facilitate accurate and facile assembly of the cathode structure.

The electron gun assembly 36 further includes an electrostatic focus lens for forming a real image of the electron source produced at the field emission tip in the vicinity of the recording medium 13. An electrostatic lens in accordance with this invention is illustrated as comprising a first electrode 66, a second electrode 68 and a third electrode 70. The first and second electrodes are dished-disc electrodes. The third electrode is a flat-disc electrode. The electrodes are spaced from each other by ceramic insulators 72, 74. The electrodes are spaced from the field emission cathode assembly by a ceramic insulator 76. The electrodes 66, 68 and 70 and the insulators 72, 74 and 76 are braed together to define a mechanically sound, hermetically sealed assembly.

The field emitter is adapted to receive a predetermined first electrical potential effective to form a high brightness electron source at the tip 60. The first electrode 66 is adapted to receive a predetermined second electrode electrical potential which is positive relative to the potential on the tip 60 and has a value effective to extract electrons from the tip 60. The first electrode 66 defines a very small aperture 78 for determining the diameter of an electron beam which is formed.

The second electrode 68 is adapted to receive an adjustable third, focusing, electrical potential which is negative relative to the aforesaid second potential applied to the first electrode 66. The second electrode 68 defines an aperture 80 which is much larger than the aperture 78 in electrode 66, as will be discussed in more detail hereinafter.

The third electrode 70 is adapted to receive a fourth, accelerating, electrical potential which is positive relative to the potential applied to the second electrode 68. The third electrode 70 defines an aperture 82 which is substantially larger than the aperture 78 in the first electrode 66, but smaller than the aperture 80 in the second electrode 68.

The second, third and fourth electrical potentials applied to the electrodes 66, 68 and 70 are selected to establish beam-focusing fields between the first and second electrodes 66, 68 and between the second and third electrodes 68, 70.

The enclosure defined by the first electrode, the rings 44, 46 and 48 and the vacuum manifold comprise an ultra-high vacuum zone for maintaining the field emitter at an appropriate vacuum level—typically $10^{-9}$ to $10^{-10}$ torr. The restricted size of the aperture 78 in the first electrode is selected, in part, with consideration for maintaining the high vacuum in the zone containing the field emitter.

Because of the necessity of minimizing the magnification of the electron source formed by the field emitting tip 60, the mangification of the source at the storage medium 13 is preferably about 0.5–2.0. The objectives of system compactness and small probe sizes implies the use of relatively short object and image distances. As will become evident when the dimensions of the system are described below, these objectives leave insufficient room at the exit of the gun to use conventional beam deflection and stigmatizing systems.

The electron gun assembly 36 includes an integrated beam deflection and stigmating system following the principles set forth and claimed in my copending application Ser. No. 895,200. The beam deflection/stigmating system is illustrated as comprising magnetic field generating means for establishing plural fields of magnetic flux through the electrostatic lens for modifying the position and cross-sectional shape of the beam. As shown in FIGS. 2–3, the magnetic field generating means comprises a system of magnetic windings 84 configured on an electrically insulative cylindrical sleeve-like mandril 86 surrounding the lens assembly.

Figure 4:
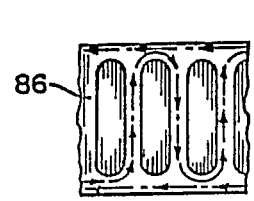
FIG. 4 is a diagram illustrating the manner in which integrated deflection and/or stigmatizing coils are wound on a mandril constituting part of the FIGS. 2-3 gun.

The windings 84 are configured to provide both X and Y beam deflection as well as quadrupolar beam stigmating. The manner in which windings 84 are wound is shown in the FIG. 4 diagram. The system of windings 84 includes X and Y beam deflection coils configured to create beam deflection fields for effecting static and/or dynamic deflection of the beam as it passes through the lens.

The system of windings 84 is also configured to create stigmatizing fields extending through the electrostatic lens and so defined as to correct cross-sectional asymmetries of the beam as it passes through the lens.

Figure 5A:
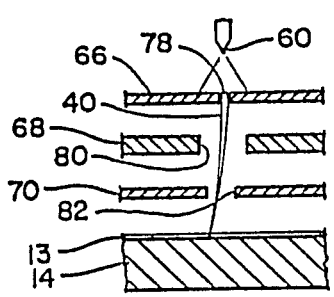
FIGS. 5A, 5B and 5C are diagrams showing the manner in which an electron beam is deflected using integrated deflection coils constituting part of the FIGS. 2-3 gun.
Figure 5B:
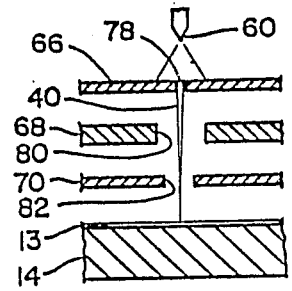
Figure 5C:
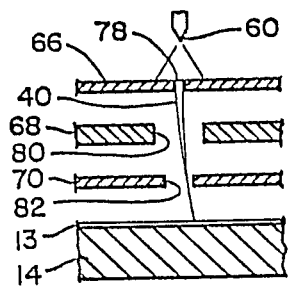

FIGS. 5A, 5B and 5C depict schematically the manner in which electron beam probe 40 is deflected within the electrostatic lens system itself to effect movement of the probe across the storage medium 13. It will be understood that in operation of the electron beam memory system, the heads 18, 19, 20 move across the disc to attain the gross positioning of electron beam during reading or writing operations. Fine positioning of the beam is achieved by use of the system of windings 84.

An electron beam deflection of only 10–20 microns is sufficient to span 100 tracks—a deflection completely adequate for recording or for locating and/or following a particular track on the storage medium 13. A more complete description of the illustrated integrated electron beam deflection and/or stigmatizing system and its features are described in my referent copending application Ser. No. 895,200.

The above embodiments are included merely as illustrative and it is contemplated that other structures may be devised to practice the teachings of the present invention. The following claims are intended to cover such other structures.

What is claimed is:

1. For use in an electrom beam device, an axially compact field emission cathode assembly comprising:
    field emission tip means for emitting electrons when excited to an appropriate electrical potential in a vacuum;
    electrical conductive wire filament means mechanically supporting said tip means for receiving and conducting to said tip means a predetermined electrical potential for exciting said filament means to cause electron emission from said tip means; and
    filament support means for supporting said filament means with said tip means positioned on an electron beam axis within said device,
    the cathode assembly being characterized by said filament means being supported at opposed ends by said filament support means to lie substantially throughout its length in a plane extending transversely to said electron beam axis, wherein to reduce the axial length of said device.

2. For use in an electron beam device, an axially compact field emission cathode assembly comprising:
    field emission tip means for emitting electrons when excited to an appropriate electrical potential in a vacuum;
    electrically conductive filament means mechanically supporting said tip means for receiving and conducting to said tip means a predetermined electrical potential for exciting said filament means to cause electron emission from said tip means; and
    filament support means for supporting said filament means with said tip means positioned on an electron beam axis within said device,
    the cathode assembly being characterized by said filament support means defining a generally circular opening and having a plane extending transversely to said electron beam axis, and said filament means being supported at opposed ends by said filament support means to lie substantially throughout its length in said plane and to extend diametrically across said opening, wherein to reduce the axial length of said device.

3. For use in an electron beam device, an axially compact field emission cathode assembly comprising:

field emission tip means for emitting electrons when excited to an appropriate electrical potential in a vacuum;

electrically conductive filament means mechanically supporting said tip means for receiving and conducting to said tip means a predetermined electrical potential for exciting said filament means to cause electron emission from said tip; and filament support means for supporting said filament means with said tip means positioned on an electron beam axis within said device, the cathode assembly being characterized by said filament support means comprising first and second conductive supports spaced by an insulator, on which supports opposed ends of said filament means are mounted, said supports being constructed and arranged such that said filament means is supported to extend transversely to said electron beam axis, wherein to reduce the axial length of said device.

4. For use in an electron beam device, an axially compact field emission cathode assembly comprising:

field emission tip means for emitting electrons when excited to an appropriate electrical potential in a vacuum;

electrically conductive filament means mechanically supporting said tip means for receiving and conducting to said tip means a predetermined electrical potential for exciting said filament means to cause electron emission from said tip means; and filament support means for supporting said filament means with said tip means positioned on an electron beam axis within said devices, the cathode being characterized by said filament support means comprising a sandwich of first and second conductive rings spaced by an insulative ring, which sandwiched defines an opening lying in a plane oriented transversely to said electron beam axis and oriented diametrically across said opening with oppositely turned ends thereof being secured respectively to said first and second conductive rings.

5. A field emission electron gun for use in electron beam memory systems, electron microscopes, electron lithograph systems and the like, comprising:

an axially compact field emission cathode assembly comprising:

field emission tip means for emitting electrons when excited to an appropriate electrical potential in a vacuum;

electrically conductive filament means mechanically supporting said tip means for receiving and conducting to said tip means a predetermined electrical potential for exciting said filament means to cause electron emission from said tip means; and filament support means for supporting said filament means with said tip means positioned on an electron beam axis within said gun, the cathode assembly being characterized by said filament means being supported at opposed ends by said filament support means to lie substantially throughout its length in a plane extending transversely to said electron beam axis, wherein to reduce the axial length of said gun;

electrode means receiving electrons from said tip means for defining an electron beam; and electrostatic lens means receiving said beam for forming a beam focus.

6. The apparatus defined by claim 5 wherein said filament support means defines a generally circular opening having a plane extending transversely to said electron beam axis, and said filament means is supported by said filament support means to extend diametrically across said opening.

7. A field emission electron gun for use in an electron beam memory system comprising:

an axially compact field emission cathode assembly comprising:

field emission tip means for emitting electrons when excited to an appropriate electrical potential in a vacuum;

electrically conductive filament means mechanically supporting said tip means for receiving and conducting to said tip means a predetermined electrical potential for exciting said filament means to cause electron emission from said tip means; and filament support means for supporting said filament means with said tip means positioned on an electron beam axis within said gun, said cathode assembly being characterized by said filament support means comprising a sandwich of first and second conductive rings spaced by an insulative ring, which sandwich defines an opening lying in a plane oriented transversely to said electron beam axis, said filament means extending transversely to said electron beam axis oriented diametrically across said opening with oppositely turned ends thereof being conducted respectively to said first and second conductive rings;

electrode means receiving electrons from said tip means for defining an electron beam; and electrostatic lens means comprising two or more apertured disc electrodes for receiving appropriate potentials to create an electrostatic field therebetween for receiving said beam and focusing said beam to a fine electron beam probe.

* * * * *